United States Patent [19]

Knepper

[11] Patent Number: 4,460,984
[45] Date of Patent: Jul. 17, 1984

[54] MEMORY ARRAY WITH SWITCHABLE UPPER AND LOWER WORD LINES

[75] Inventor: Ronald W. Knepper, Lagrangeville, N.Y.

[73] Assignee: International Business Machines Corporation, Armonk, N.Y.

[21] Appl. No.: 336,004

[22] Filed: Dec. 30, 1981

[51] Int. Cl.$^3$ ............................................. G11C 11/40
[52] U.S. Cl. .................................... 365/190; 365/154
[58] Field of Search ............... 365/154, 156, 189, 190, 365/202, 205, 207

[56] References Cited

U.S. PATENT DOCUMENTS

| | | | |
|---|---|---|---|
| 3,969,707 | 7/1976 | Lane et al. | 365/49 |
| 4,164,791 | 8/1979 | Homma | 365/190 |
| 4,193,127 | 3/1980 | Gersbach | 365/174 |

OTHER PUBLICATIONS

F. C. Wernicke, "Circuit Concept for Rapidly Reading and Writing Semiconductor Storages With Diode-Coupled Cells," IBM Technical Disclosure Bulletin, vol. 25, No. 6, Nov. 1982, pp. 2746-2750.

Wiedmann, IBM Technical Disclosure Bulletin, Aug. 1970, pp. 616-617, "Memory Cell".
Berger et al., IBM Tech. Bulletin, May 1974, pp. 3965-3967, "Content Addressable Storage Cell."
Lynes et al., IEEE J. Solid State Circuits, V. SC-5, pp. 186-191, Oct. 1970, "Memory Using Diode-Coupled Bipolar Transistor Cells".

*Primary Examiner*—Joseph A. Popek
*Attorney, Agent, or Firm*—T. E. Galanthay; John A. Jordan

[57] ABSTRACT

Disclosed is a memory array in which each cell consists of a pair of cross coupled bipolar transistors with antisaturation clamps, a load resistor connected to the collector of each of the cross coupled transistors forming storage nodes, and Schottky barrier diode input-/output devices connecting each node to a respective bit line. The emitters of the cross coupled transistors are connected to a lower word line while the load resistors are connected to an upper word line. Both the upper and lower word lines are switchable providing high speed as well as highly stable operation with very low power supply voltage requirements.

2 Claims, 4 Drawing Figures

MEMORY ARRAY WITH SWITCHABLE UPPER AND LOWER WORD LINES

DESCRIPTION

FIELD OF THE INVENTION

This invention relates to a random access memory array. More particularly, it relates to a memory array having Schottky barrier diode coupled bipolar transistor cells that are high speed, highly stable, and operable with low power supply voltage requirements.

CROSS REFERENCES, RELATED PATENTS AND PUBLICATIONS

1. Lane et al U.S. Pat. No. 3,969,707 issued July 13, 1976, entitled "Content-Addressable Memory Capable of a High Speed Search."
2. Gersbach, U.S. Pat. No. 4,193,127 issued Mar. 11, 1980, entitled "Simultaneous Read/Write Cell."
3. Wiedmann, IBM Technical Disclosure Bulletin, dated August 1970, pages 616–617, entitled, "Memory Cell."
4. Berger et al, IBM Technical Bulletin, data May 1974, Pages 3965–3967, entitled "Content Addressable Storage Cell."
5. Lynes et al. IEEE J. Solid State Circuits, Vol. SC-5, Pages 186–191, October 1970, entitled "Memory Using Diode-Coupled Bipolar Transistor Cells."

BACKGROUND OF THE INVENTION

Memory arrays having cross coupled bipolar transistors as storage cells are notoriously well known. Frequently referred to as "flip-flop" cells, the binary state of the cell is determined by which of the two cross coupled transistors is conducting current.

One type of flip-flop cell is the diode coupled bipolar transistor cell, as shown in the above mentioned Wiedmann publication. In the Wiedmann cell, diodes are used to couple each of the bit lines to each of the storage nodes. Load resistors couple each of the storage nodes to a fixed upper potential. A single word line is connected to the emitters of the cross coupled transistors. A detailed description of the operation of this cell in a memory array is found in the Lynes et al publication referenced above.

Further improvements and modifications of the diode coupled cell are found, for example, in the above referenced Berger et al publication in which Schottky barrier diodes have been used to replace the standard diodes as input/output devices between the respective storage nodes and bit lines. It is also known to substitute PNP load devices for conventional resistive loads.

A further improvement to the diode coupled flip-flop cell is the addition of antisaturation devices in the form of Schottky barrier diodes as illustrated in the above referenced U.S. Pat. No. 3,969,707. The storage cell circuit of U.S. Pat. No. 3,969,707 incorporates all the preferred advantageous features of a diode coupled flip-flop cell. Moreover, Schottky barrier diodes are used not only as the input/output coupling diodes, but also as antisaturation devices. A simple resistive load of 10 kilo-ohms coupled to each storage node is also described. The cell is used in the context of a content addressable memory rather than a random access memory. To this end, additional connections are made to the storage nodes, an undesirable addition in the case of a random access memory. Also, only a single word line connected to the emitters of the cross coupled transistors is used to access a row of cells. The commonly connected other end of the load devices is connected to a fixed potential (ground). Also, a power supply difference of 4.25 volts (from ground to −4.25) is shown in FIG. 1. Such a high power supply potential difference requirement and the lack of a provision for a switchable upper word line prevent the operation of this cell in the advantageous manner provided by this invention. Thus, although this patented cell has the same circuit component count and resultant compactness as was found highly desirable in the present invention, this patent fails to suggest the high speed, stable operation, and low power supply requirements which are provided by the advantageous features of this invention.

SUMMARY OF THE INVENTION

Accordingly, it is an object of this invention to improve the speed of operation as well as the stability of a random access memory array consisting of diode coupled flip-flop memory cells.

It is a further object of this invention to operate a diode coupled flip-flop memory cell with a minimal power supply voltage requirement.

Lastly, it is an object of this invention to provide an improved random access memory array having diode coupled flip-flop cells with minimal component count permitting low cost, dense monolithic integrated circuit fabrication.

These and other objects of this invention are achieved by providing an upper word line in addition to the customary lower word line so that each memory cell is accessed by four switchable lines including two word lines and two bit lines. A current mirror provides constant read and write currents which are selectively switched to desired upper and lower word lines by current switch connected transistors. Current switches are known to provide extremely high speed switching operation. A second level of current switch operation is provided by the cell itself.

The particular sense amplifier configuration isolates the bit line capacitance from the sense amp output node (and vice versa) providing high speed sensing. The sense amplifier provides a complementary voltage at the sense output in response to a current difference at its input (i.e. the bit lines).

DESCRIPTION OF THE PREFERRED EMBODIMENT

Figure 1:
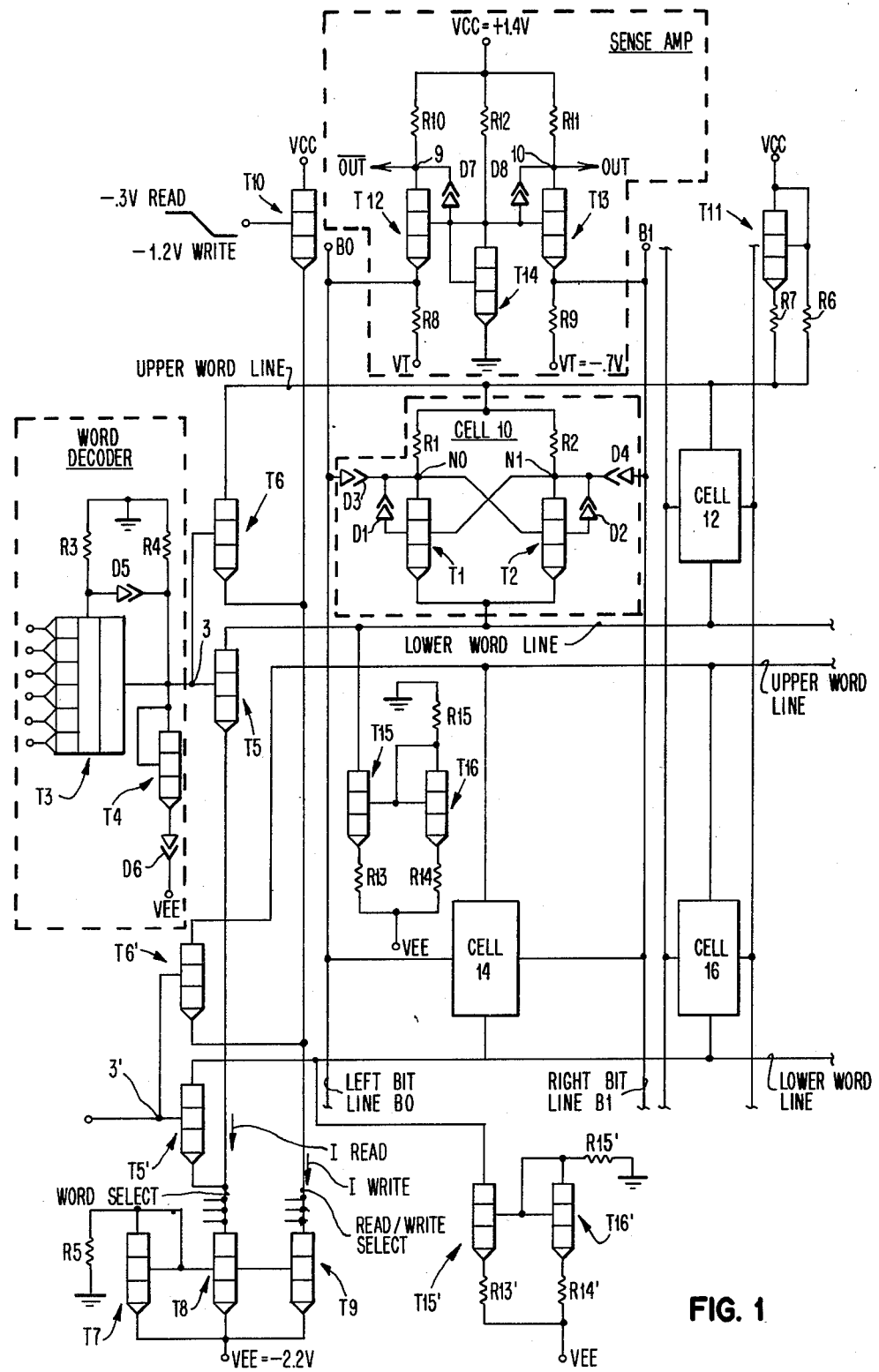
FIG. 1 is a schematic diagram of the preferred embodiment of the random access memory array of the present invention.

Refer now to FIG. 1 for a description of the preferred embodiment. Cell 10 is shown in detail while cells 12, 14 and 16 are depicted by block diagrams. All cells in an array are identical and include the circuit elements illustrated in detail for cell 10. Although a matrix of four cells is shown, it is known that 64 or more cells are located along each pair of bit lines (column) and 32 or more cells are located along each pair of word lines (row). As illustrated with respect to cell 10, each memory cell in the array includes a bipolar transistor T1 and a bipolar transistor T2 connected in the standard cross-coupled fashion at their respective bases and collectors. Schottky diodes D1 and D2, which are connected between the base and collector of transistors T1 and T2, respectively, function in the usual manner as anti-saturation devices to enhance the cell's switching speed by reducing minority carrier storage in the base regions. The superiority of Schottky barrier diodes over conventional diodes is well known to semiconductor designers. However, it it obvious that other types of low barrier diodes will also perform suitably.

Each cell also includes a pair of input/output Schottky barrier diodes D3 and D4, as shown. Lastly, each cell contains a pair of load resistors R1 and R2, also as shown. A first storage node N0 is formed at the common connection of the collector of T1, the cathode of D1 and D3 and one end of load resistor R1. A second storage node N1 is formed at the common connection of the collector of T2, the cathodes of D2 and D4 and one end of resistor R2. Each of the just described components is required for the proper operation of this memory array, although additional components would needlessly increase the size and complexity of each cell and consequently the overall memory array.

Each memory cell requires four access points, provided by two word lines and two bit lines. In the prior art, diode coupled cells of this type were accessed by two bit lines and one word line, but lacked an upper word line. In place of an upper word line, the prior art provided for the application of a fixed potential to load resistors R1 and R2.

In accordance with the present invention, an upper word line is conductively connected and forms a common connection with load resistors R1 and R2. A lower word line is conductively connected and forms a common connection with the emitters of transistors T1 and T2. Schottky barrier diode D3 forms an input/output connection coupling left bit line B0 to the storage node N0. Schottky barrier diode D4 is an input/output diode coupling right bit line B1 to storage node N1. Each of the other cells 12, 14, 16 as well as additional cells not shown in this illustrative embodiment are connected to a pair of bit lines and word lines in a manner similar to cell 10.

It is well known that random access memory arrays require word decoders, bit decoders, and sense amplifiers in order to access a particular memory cell within the array for the purpose of writing information into or reading information out of a particular cell. These will now be described. As will be noted, the particular arrangement of circuit elements and their coaction with each other and the memory cells constitute the unique arrangement providing improved speed and stability for the memory array. In this regard, the word decoder will first be described.

As shown, the word decoder includes multiemitter transistor T3 connected in conventional TTL fashion with Schottky barrier diode D5 connected base to collector as an anti-saturation clamp. Resistor R3 is connected between ground potential and the base of T3. The collector of T3 is coupled to potential VEE by the series connection of Schottky barrier diode D6 and diode connected transistor T4. As an alternative, Schottky barrier diode D6 could be eliminated from each decoder, with the emitter of T4 (and all corresponding transistors in the other word decoders) being bussed to −1.6 volts. The collector of T3 is resistively coupled to ground potential by resistor R4. The output of the word decoder is provided at the collector of T3 which is connected to node 3 and to the base of transistors T5 and T6. The collector of T5 is connected to the lower word line while its emitter is connected to the word select line. The collector of T6 is connected to the upper word line while its emitter is connected to the read/write select line. As will become more apparent, transistor T6 conducts only during a write cycle while transistor T5 conducts during both a read and a write cycle when the row to which it is connected is selected. Since one or the other of transistors T1 or T2 in each of the cells along a lower word line conducts current at all times, transistor T5 must be sufficiently large to accommodate a relatively high current. For example, if 32 cells are placed along the word line, then T5 must be able to carry 32 times the current passing through any one cell. Alternatively, the decoders can be arranged in a column along the center of the chip, permitting the provision of 64 cells in a row, 32 to each side of the decoders. With this alternative two transistors T5 are required, one for each set of 32 cells. On the other hand, the one transistor T6 can be used to switch the entire upper word line for all 64 cells because of a smaller current requirement.

A separate word decoder is provided for each pair of word lines. Thus, for the row of cells including cell 14, cell 16, etc, another word decoder provides an output to node 3′ which is connected to the base electrodes of transistors T5′ and T6′. In the event 64 cells are placed along the illustrated column including left bit line B0 and right bit line B1, then 64 word decoders with 64 corresponding transistors T5 and T6 are required.

An essential element in the overall operation of this memory array is a constant current source that will provide constant read and write currents. This is provided by the current mirror consisting of transistors T7, T8, and T9 and resistor R5. The collector and base of T7 are connected in common and to resistor R5 which has its other end connected to ground potential. The collector of T8 is connected to the word select line while the collectors of T9 is connected to the read/write select line. The base electrodes and emitter electrodes of all three transistors are connected in common, the emitter electrodes being connected to terminal VEE. All three transistors are fabricated as identical transistors in integrated circuit form. Current through R5 forward biases transistor T7 and with the same base to emitter voltage applied to T8 and T9, the same current will flow in all three transistors. Also connected to the read/write select line is the emitter of transistor T10 which has its collector connected to VCC. Transistor 10 receives a read/write clock signal at its base terminal thereby determining whether a read or write operation is to take place.

Each of the upper word lines is resistively coupled to a positive source of potential VCC. Illustrated is a particular circuit including transistor T11, resistor R6, and resistor R7. This provides a non-linear impedance. Any other type of non-linear impedance, or even a linear impedance such as a simple resistor could be used to couple each of the upper word lines to potential VCC.

Another essential element in the overall memory array is the sense amplifier. There is one sense amplifier provided for each pair of bit lines B0 and B1. Thus, assuming a row of 32 cells along a particular word line, 32 sense amplifiers are required. In the alternate arrangement of 32 cells on each side of the decoders, 64 sense amplifiers are required. The illustrated sense amplifier is a grounded base design. By that is meant that the base electrodes of transistors T12 and T13 are connected in common and form an AC ground. The emitter of T12 is connected to left bit line B0 and to resistor R8 which in turn is connected to terminal VT. VT is a potential source of approximately −0.7 volts but could also be connected to the VEE supply which is at −2.2 volts. The emitter of T13 is connected to the right bit line B1 and to resistor R9 which has its other end connected to the same potential VT as resistor R8. The commonly connected base electrodes of T12 and T13 are connected to the collector of diode connected transistor T14 which has its emitter connected to ground potential. The ground potential is used as a reference voltage VR. The base collector junctions of T12 and T13 are connected by Schottky barrier diodes D7 and D8, respectively, operating as anti-saturation clamps. The collectors of transistors T12, T13, and T14 are resistively coupled to the VCC potential source by load resistors R10, R11, and R12, respectively.

Lastly, during standby there is a requirement that the lower word lines by coupled to VEE. For the lower word line in the row of cells 10, 12, etc, this is provided by a circuit including transistors T15 and T16 and resistors R13, R14 and R15, connected as shown. The collector of T15 is connected to the lower word line and has its base connected to the base of T16. T16 has its base and collector contacts diode connected and also resistively coupled by means of R15 to the ground terminal. The emitter of T15 is connected to resistor R13 while the emitter of T16 is connected to resistor R14. The other ends of R13 and 14 are connected in common and to VEE. The word line for the row of cells 14, 16, etc, is connected to a similar circuit in which corresponding circuit components are noted by prime notation.

Figure 2:
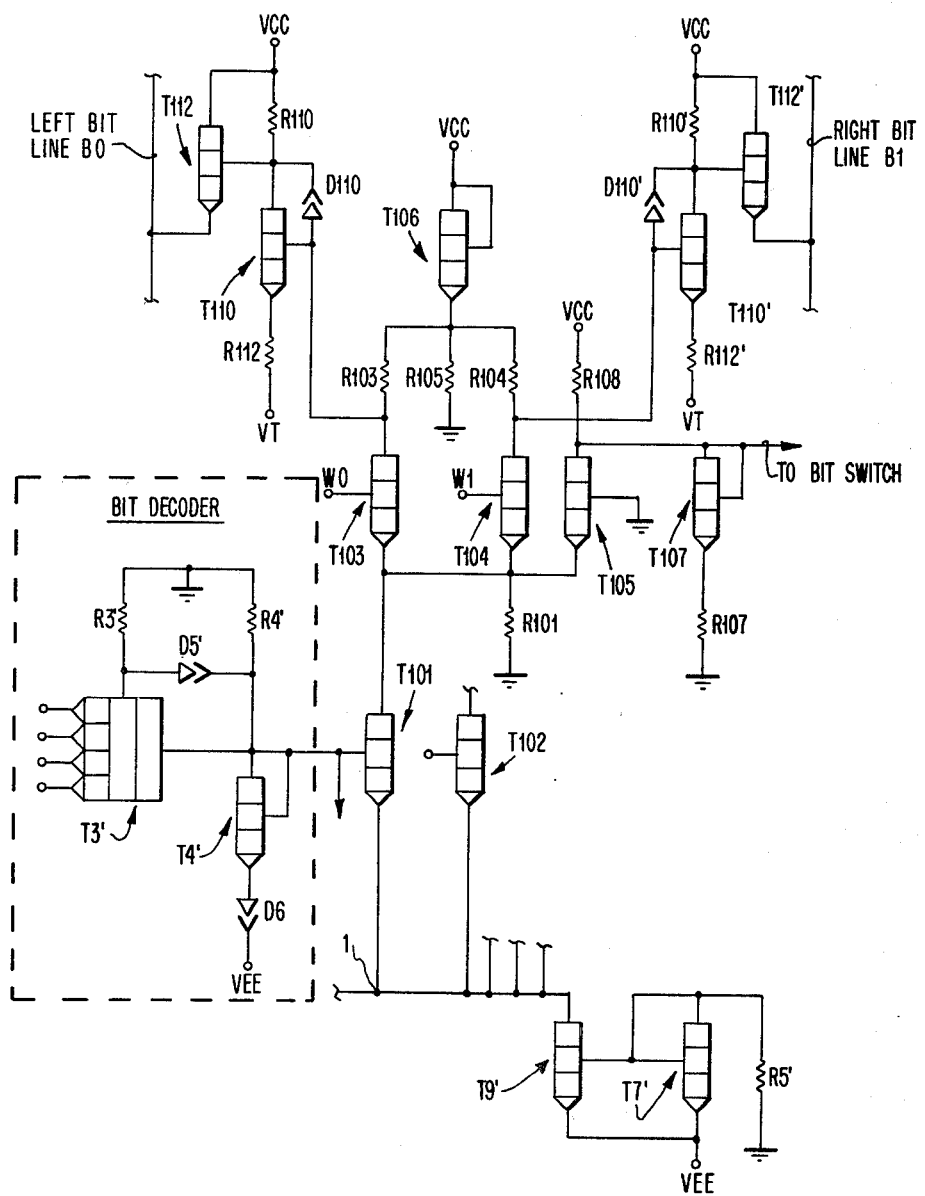
FIG. 2 is a schematic diagram of the bit selection circuit for the random access memory array of FIG. 1.

Refer now to FIG. 2 for a descripion of the bit selection circuit. The bit selection circuit provides the appropriate input to left bit line B0 or right bit line B1 depending on whether a binary 1 or 0 is to be written or whether a read operation is taking place. Similarly, the circuit of FIG. 2 provides the control signal to the customary bit switch transistor(s) (not shown) for gating the true and/or complementary outputs of the sense amplifier in FIG. 1.

In order to select an appropriate pair of left and right bit lines B0 and B1, bit decoders are required. The bit decoder suitable for use in the memory array of this invention is similar to the word decoder previously described in FIG. 1. For this reason, in the FIG. 2 circuit corresponding elements have been labeled in prime notation for facilitating the explanation. Multi-emitter transistor T3' is shown with four emitters instead of the six emitters illustrated for transistor T3. Those skilled in the art will recognize that the number of emitters of such a multi-emitter transistor is a design choice depending on the number of bits to be decoded.

The bit selection circuit of FIG. 2 also uses a current mirror as a current source generator as was used in the FIG. 1 circuit. Since the same type of current mirror is utilized, corresponding elements have again been indicated with prime notation for facilitating the explanation. Although resistor R5' is shown connected to ground, other more positive potentials, such as VCC would provide desired constant current. The constant current drawn through transistor T9' is connected to a plurality of transistors T101, T102, etc., the number of these transistors depending on the size of the memory array. The base electrode of transistor T101 is connected to the collector of T3', the output of the illustrated bit decoder. Another bit decoder (not shown) has its output connected to the base of transistor T102, and so forth so that one of transistors T101, T102 and so forth is conducting at all times while the remainder of these transistors are off. The collector of T101 is connected to the commonly connected emitter electrodes of T103, T104, and T105. These three commonly connected emitters are also connected to resistor R101 which is connected to ground potential as well. The base of T103 is connected to the W0 terminal while the base of T104 is connected to the W1 terminal. One or the other of these base electrodes is activated depending on whether a binary 0 to 1 is to be written. Both W0 and W1 are held at a down level for a read operation. The base of T105 is connected to ground potential. The collector of T103 is connected to a bit driver that provides enhanced driving capability for driving the left bit line B0. The left bit line driver includes inverter transistor T110 and emitter follower transistor T112 connected as shown. T110 has its base and collector clamped by Schottky diode D110. Resistor R110 is the collector load for T110, while resistor R112 is connected between the emitter of T110 and terminal VT. Those skilled in the art will recognize that various other inverter, emitter follower circuits would also perform the desired function. The collector of T104 is similarly connected to the corresponding inverter/driver for bit line B1. Prime notation has been used to indicate corresponding circuit components.

The collector of T103 is also connected to R103 while the collector of T104 is connected to the load resistor R104. The other end of R103 and R104 are commonly connected to each other and to resistor R105 and the emitter of transistor T106. T106 is a diode connected transistor with its collector connected to potential terminal VCC. The other end of resistor R105 is connected to ground potential. It is the function of T106 and R105 to set a level one base-emitter voltage drop below VCC at the common connection of R103 and R104. However, the common connection of R103 and R104 can be connected directly to VCC, eliminating T106 and R105.

The load resistor for transistor T105 is resistor R108 which has its other end connected to terminal VCC. The base electrode of T105 is connected to ground (a reference potential), thereby forming a current switch circuit with T103 and T104. As will become apparent, whenever T101 is turned on, either T105 or one of transistors T103/T104 is turned on to carry the constant current. The collector of T105 provides an output to the bit switch (not shown). The collector of T105 is coupled to ground potential by means of diode connected transistor T107 connected in series with resistor R107. Having thus described the various structural details of this invention, the operation will now be described.

OPERATION

Figure 3:
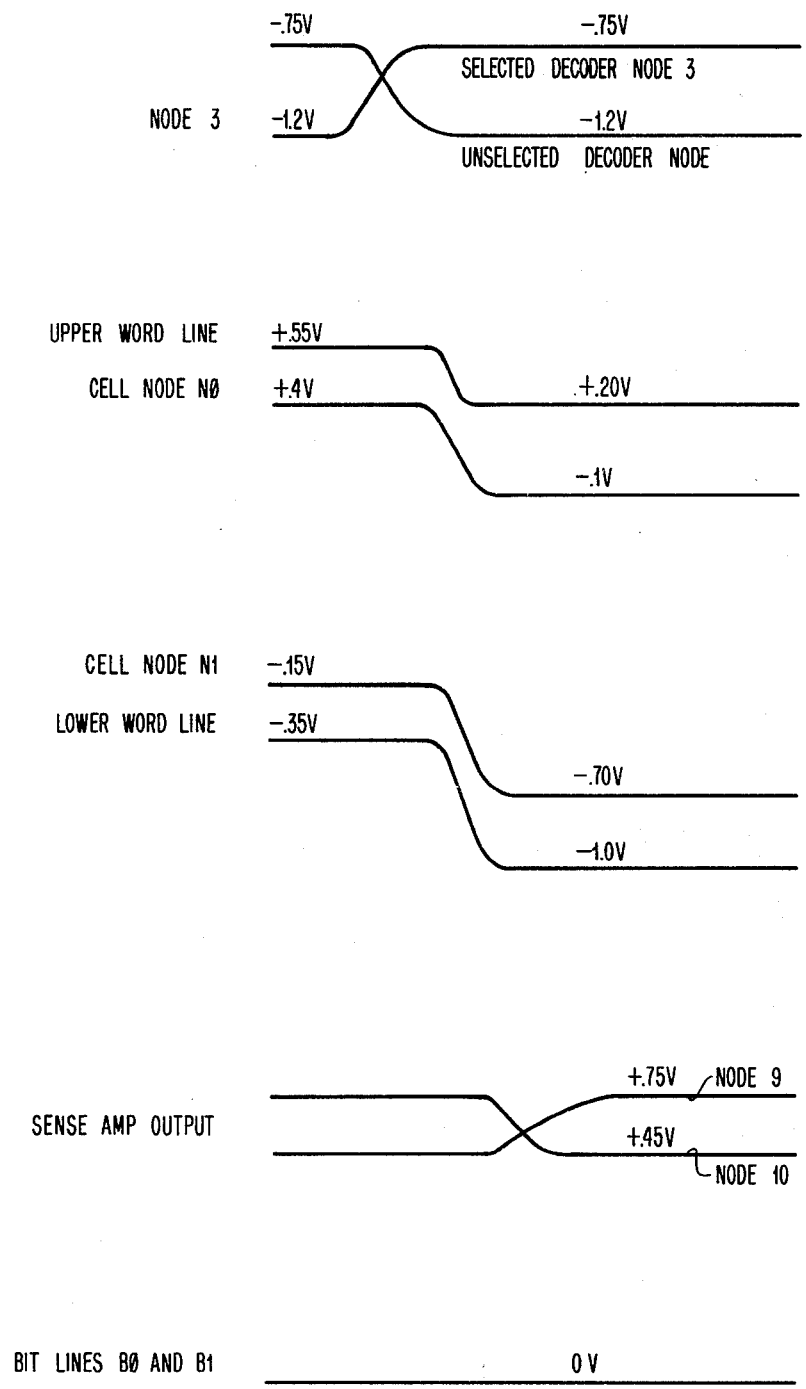
FIG. 3 is a waveform diagram depicting the read operation of the random access memory array of FIG. 1.
Figure 4:
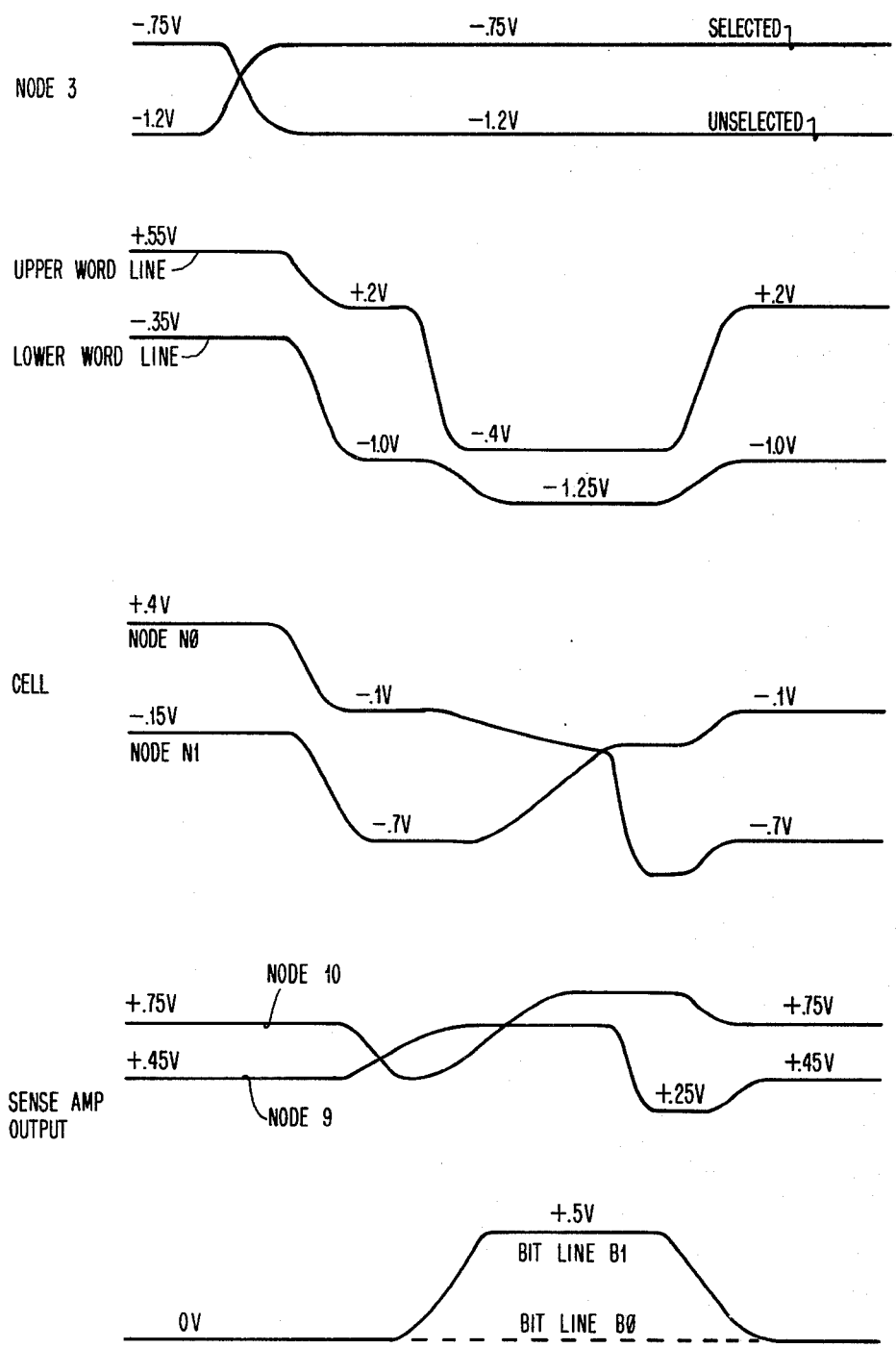
FIG. 4 is a waveform diagram depicting the write operation of the random access array of FIG. 1.

The operation of the memory array in accordance with this invention will be best understood by continued reference to FIGS. 1 and 2 while also referring to the waveform diagrams of FIGS. 3 and 4. The operations of read and write will be described in sequence. Specific voltages have been provided for all the terminals: VCC, VEE, VT and ground, with corresponding waveform amplitudes.

First, the read operation will be described. In order to access cell 10 in FIG. 1 all of the emitter terminals of transistor T3 must be brought to an up level. The inputs to the emitter terminals of T3 are received from the chip address receiver circuit (not shown). Typically the up level input at the emitters of T3 is near −0.5 V while the down level input is near −1.5 V. Thus, to select the particular word decoder illustrated in FIG. 1, all the emitters of T3 must be brought to an up level. This results in the potential at node 3 being brought from a down level of −1.2 volts to an up level of −0.75 volts. The up level is clamped by diode connected transistor T4 connected in series with Schottky barrier diode D6 which is connected to VEE. This up level of node 3 is applied to the base of transistor T6 and to the base of transistor T5.

Transistor T6 is connected in a current switch configuration with T6' and all other (e.g. 64) transistors (not shown) along the column, with T9 being the constant current source. However, since T6 as well as T6', etc. are also connected in a current switch configuration with transistor T10, with T9 forming a constant current source, selected transistor T6 can conduct only if its base is at a higher potential than the base of T10. During a read operation, the base of T10 is held at a sufficiently high level (e.g. −0.3 volts) so that T10 continues to conduct regardless whether the base of T6 is at an up or down level. Thus, in the read mode none of transistors T6, T6' etc. are turned on. Transistor T5, however, is in a current switch connection with the other transistors T5', etc. one of which must be on to conduct the constant current drawn through transistor T8. (The actual value of this current is determined by the size of R5 which forward biases T7, T8 and T9 so that all three of these transistors will conduct identical currents.) Since in this example the base of T5 has been brought to an up level, T5 begins to conduct bringing the lower word line from approximately −0.35 volts to approximately −1.0 volts. The emitters of T1 and T2 (as well as the other e.g. 32 cells along this word line) are thus brought to −1.0 volts. This results in increased current flow through the cells, bringing the upper word line down from +0.55 to +0.20 volts.

It should here be pointed out that all voltage and current values are given by way of explanation not limitation in the overall description of this invention. Also, for the purposes of this example, assume that the binary state of the cell is such that at standby node N0 is at +0.4 volts and cell node N1 is at −0.15 volts. These standby voltages are determined by transistors T15 and T16 as well as the size of resistors R13, R14 and R15, this latter circuit setting the potential of the lower word line in the standby state.

In this assumed example, the stored binary bit has cell 10 in the state that transistor T2 is conducting while transistor T1 is off. (Thus during standby node N1 is at −0.15 with node N0 at +0.4. When the lower word line is brought down, each of the cells along the word line will conduct harder, the on transistor taking all the current with the off transistor being turned fully off.) In this example, transistor T2 will conduct harder steering a fraction of the constant current of transistor T8 through diode D4, thereby drawing extra current through transistor T13. This added current drawn through T13 brings the output node 10 down from approximately +0.75 volts in the standby state to +0.45 volts during the read operation. Simultaneously, T12 will conduct less current causing the complement output at its collector to rise to +0.75 volts. Resistors R8 and R9 cause transistors T12 and T13 to be continually biased on and conducting bleeder current through load resistors R10 and R11, respectively, regardless of the state of cell 10 (or other selected cell on the column). This bleeder current causes T12 and T13 to operate as a high speed linear differential amplifier and also determines the up level (+0.75 volts) on node 9 (or 10). Since one cell along the column is always selected, additional sense current will always flow through T13 (or T12) and will therefore determine the down level (+0.45 volts) on node 10 (or 9).

It should be pointed out that the state of the sense amplifier prior to a read operation depends on the state of the previously read cell. In the wave form diagram illustrated in FIG. 3, it has been assumed that a bit opposite in binary state from the one being sensed was previously sensed so that the timing of the transition can be seen. It is, of course, to be understood that if the binary bit sensed in cell 10 is the same as the previously sensed bit along the column then there is no change in the relative up and down levels of the true and complementary outputs at the collector of T12 and T13. In the just described read operation, cell 10 was assumed to be storing a binary "1" in which T2 was conducting. Thus, node N0 was one base emitter voltage drop above the lower word line while node N1 was one base emitter voltage drop minus one Schottky barrier diode voltage drop above the lower word line. In other words before selection N0 was at approximately +0.4 volts while node N1 was at approximately −0.15 volts. This 550 millivolts difference between the two storage nodes result in an extremely stable DC stable storage cell. As can be seen in the wave form diagram of FIG. 3, this difference is maintained during the read operation and becomes a 600 millivolt (−0.1 to −0.7 volt) difference resulting in very high stability throughout the read operation.

In addition to this high stability, high speed reading is accomplished by the two level current steering. The first level of current steering is in the selection of transistor T5 steering the constant current drawn by T8 from another word line to the selected lower word line. The second level of current steering occurs in the cells where the fractional part of this constant current is steered to the conducting one of the two cross coupled transistors, this constant current being drawn through the corresponding Schottky barrier input/output diode and the corresponding half of the sense amplifier. It is further noteworthy to point out that the single current source on the word select line is used both to select a desired lower word line and to read the information from the cell along the word line. Those skilled in the art will recognize that the outputs of the sense amplifier at nodes 9 and 10 can be further supplied to bit switches (not shown) to read out the content of a single cell along the selected word line.

In the foregoing read operation, the bit lines B0 and B1 were maintained at ground potential, by means of bias provided by the sense amplifier. During a write operation, however, one of the bit lines is held at a higher level by the circuit of FIG. 2. The FIG. 2 circuit includes a bit decoder and a constant current source formed by a current mirror, as previously described. Assuming that this particular bit decoder is selected, all the inputs at the emitter terminals of T3' are brought to up levels bringing the collector of T3' to an up level. This will turn transistor T101 on while turning all other similarly connected transistors T102, etc. off. T101 being in a current switch relationship with T102, etc. a constant current provided by the current mirror is steered entirely through T101. This same constant current will then be drawn through one of transistors T103, T104 or T105 and finally through R103, R104, or R108 generating either a write 1 signal, a write 0 signal, or a bit switch gating signal.

Accordingly, during a read operation, W0 and W1 are maintained at a down level. This causes T105 to be on, providing a down level gating signal to the appropriate bit switch to perform the read operation. Also, with W0 and W1 at a down level, T103 and T104 are off, holding T112 and T112' off. This permits bit line B0 and B1 to be biased near ground potential by the sense amplifier and to be switched by the selected cell.

The bit decoder is a standard TTL circuit. The series NPN diode T4' and Schottky barrier diode D6' connected to VEE form a clamp to set the up level at the decoder internal code. As noted with respect to FIG. 1, as an alternative, the emitter of T4' can be bussed to −1.6 volts and Schottky barrier diode D6' can then be removed from each bit decoder. The decoder with all inputs high is selected, causing the internal node to be high, turning T101 on. All other decoders have 1 or more inputs down causing their internal nodes to be discharged and in a down state, causing T102, etc. to be off.

Resistor R101 is a high value resistor to maintain the common node of the emitters of T103, T104, and T105 at ground potential for all de-selected bits. This prevents the W0/W1 lines from causing a glitch at either the collector of T103 or the collector of T104 of the de-selected bits due to capacitive currents (in charging the common emitter nodes of T103, T104 and T105) when the W0 or W1 line comes up. Device T107 and resistor R107 form a clamp to set the up level at the collector of T107 at the desired voltage.

In the description of the read operation, the bit lines B0 and B1 were maintained at ground potential by virtue of terminals W0 and W1 being both kept at a down level so that T103 and T104 were both off and the bit line levels could be set by the sense amp. In order to perform a write operation, one of terminals W0 and W1 must be brought to an up level. When either W0 or W1 is brought to an up level, T105 is turned off so that a negative gating signal is not provided to the bit switch. Assuming that W0 is brought to an up level, T103 will turn on turning T110 off. This permits the collector of T110 to rise to VCC (+1.4 volts). This turns T112 on, bringing the left bit line B0 to an up level of approximately +0.5 V, approximately one base to emitter voltage drop below VCC. The write operation for the right bit line B1 is identical to that of the left bit line when W1 is brought to an up level while W0 is maintained at a down level.

In a write operation, the appropriate word decoder (FIG. 1) must again be selected so that the signal at node 3 (the base of transistors T5 and T6) is identical in a write operation as it was in the previously described read operation. T5 turns on during the write as well as in the previously described read operation steering current from the selected lower word line bringing it down from −0.35 V to −1.0 V. As noted in the wave form diagram of FIG. 4, this brings the upper word line to +0.2 V, cell node N0 to −0.1, cell node N1 to −0.7 and to this point the circuit looks exactly as if it were performing a read operation. However, at this point in time the down level write signal input at the base of transistor T10 signals that a write operation is to take place. The down level write signal at the base of T10 brings the base of T10 to a voltage lower than the base of T6. As previously mentioned, T6 and T10 are connected in a current switch configuration so that the constant current of T9 is switched from T10 (which turns off) to T6 (which turns on) bringing the upper word line sharply down to −0.4 V. At the same time, bit line B1 is brought to +0.5 V while bit line B0 remains at 0 V as determined by the circuit of FIG. 2. This causes cell node N1 to be charged up through Schottky barrier diode D4 while cell node N0 slowly discharges through resistor R1 (in view of the fact that the upper word line is now at a lower potential than cell node N0). At a critical point (approximately −0.3 V), the potential of cell node N1 begins to exceed the potential of N0 and the state of the cell is considered to have been switched. As T1 turns on, current is drawn through Schottky barrier diode D3 and transistor T12 bringing sense node 9 down. The conductive state of transistor T1 brings cell node N0 to below −0.7 V and sense amplifier node 9 to +0.25 V. This could cause saturation of T12 which is prevented by the clamping action of Schottky barrier diode D7. At this point in time the read/write signal at the base of T10 is returned to an up level turning T10 on and thereby T6 off causing the upper word line to return to +0.2 V. At the same time, the bit circuitry turns the on one of T112/T112' off so that the sense amp brings the bit line B1 level back to 0 volts returning the cell to the read mode. At a later point in time, when the lower word line is de-selected the cell goes back to its standby condition as illustrated at the beginning of the timing diagram of FIG. 3.

What has then been described is a high speed highly stable memory array using Schottky coupled flip-flop memory cells. The array is characterized by several levels of current switching operations (known to be very fast) and an integral relationship between the cells, sense amplifier and other support circuits. This combination of elements results in high speed operation and requires relatively low power supply potentials.

While the invention has been particularly shown and described with reference to a preferred embodiment thereof, it will be understood by those skilled in the art that there are changes in form and detail which may be made therein, without departing from the spirit and scope of the invention. For example, the conductivity type of the transistors used in the circuit could be reversed with the appropriate changes in the biasing arrangement. The characteristics of the transistors, diodes, and other components could be altered as desired to change the various signal levels throughout the cells.

What is claimed is:

1. A random access memory array having a plurality of memory cells, each said memory cell consisting of first and second cross coupled transistors, first and second clamping diodes connected between the collector and base regions of each of the first and second transistors, first and second storage nodes, a first load resistor connected to the first storage node, a second load resistor connected to the second storage node, the other ends of each of the load resistors being connected in common and to an upper word line, the emitters of said first and second transistors being connected in common and to a lower word line, a first Schottky barrier diode input/output device connecting the first storage node to a first bit line, a second Schottky barrier diode forming a second input/output device connecting the second storage node to a second bit line, the improvement comprising:
- a third transistor having collector, base and emitter regions and having its collector region conductively connected to said upper word line and arranged to receive a decode signal at its base region;
- a fourth transistor having collector, base and emitter regions and having its emitter region coupled to the emitter region of said third transistor to form a current switch therewith and arranged to recieve a control signal at its base region;
- a fifth transistor having collector, base and emitter regions with its collector region connected to said lower word line and its base region arranged to receive a decode signal, and sixth, seventh and eighth transistors each having collector base and emitter regions, the emitter regions of each of said sixth, seventh and eighth transistors being connected to a common potential source, the base regions of each of said sixth, seventh and eighth transistors being commonly connected together and the collector region of said eighth transistor connected both to its base region and ground through resistor means, the collector region of said seventh transistor being connected to the emitter region of said fifth transistor and the collector region of said sixth transistor being connected to said emitter regions of said third and fourth transistors,
- said collector regions of said sixth and seventh transistors providing the same constant current to the said emitter regions of said third, fourth and fifth transistors,
- said fifth transistor upon receiving said decode signal at its base region to render said fifth transistor conductive acts to alter the potential level on said lower word line in accordance with current switched therethrough from said seventh transistor, and
- said third transistor upon receiving said decoder signal at its base region to render said third transistor conductive acts to alter the potential level on said upper word line in accordance with current switched therethrough from said sixth transistor when the potential level of said decoder signal exceeds the potential level of said control signal.

2. A random access memory as in claim 1 having a sense amplifier connected to said first and second bit lines, said sense amplifier comprising:
- a pair of transistors each having collector, base and emitter regions and having their base electrodes connected in common and coupled to a reference potential, said bit lines being respectively connected to the emitter regions of said pair of transistors; and
- a pair of load resistors respectively connected to said collector regions of said pair of transistors.

* * * * *

UNITED STATES PATENT AND TRADEMARK OFFICE
CERTIFICATE OF CORRECTION

PATENT NO. : 4,460,984

DATED : July 17, 1984

INVENTOR(S) : Ronald W. Knepper

It is certified that error appears in the above-identified patent and that said Letters Patent is hereby corrected as shown below:

Col. 1, line 23, "data" should read --dated--.

Signed and Sealed this

Twenty-eighth Day of April, 1987

Attest:

DONALD J. QUIGG

*Attesting Officer*  *Commissioner of Patents and Trademarks*